US011017522B2

(12) United States Patent
Chou et al.

(10) Patent No.: US 11,017,522 B2
(45) Date of Patent: May 25, 2021

(54) INSPECTION AND CLEANING SYSTEM AND METHOD FOR THE SAME

(71) Applicant: TAIWAN SEMICONDUCTOR MANUFACTURING CO., LTD., Hsinchu (TW)

(72) Inventors: Chung-Pin Chou, Hsinchu (TW); In-Tsang Lin, Kaohsiung (TW); Sheng-Wen Huang, Taichung (TW); Yu-Ting Wang, Taichung (TW); Jui-Kuo Lai, Taichung (TW); Hsin-Hui Chou, Hsinchu County (TW); Jun-Xiu Liu, Taichung (TW); Tien-Wen Wang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 110 days.

(21) Appl. No.: 16/388,435

(22) Filed: Apr. 18, 2019

(65) Prior Publication Data

US 2020/0334800 A1 Oct. 22, 2020

(51) Int. Cl.
| | |
|---|---|
| *G06T 3/40* | (2006.01) |
| *G06K 9/62* | (2006.01) |
| *H01L 21/02* | (2006.01) |
| *H01L 21/66* | (2006.01) |
| *G06T 7/00* | (2017.01) |

(52) U.S. Cl.
CPC ............ *G06T 7/001* (2013.01); *G06K 9/6256* (2013.01); *G06T 3/40* (2013.01); *H01L 21/02057* (2013.01); *H01L 22/12* (2013.01); *G06T 2207/10061* (2013.01); *G06T 2207/20081* (2013.01); *G06T 2207/20084* (2013.01); *G06T 2207/30148* (2013.01)

(58) Field of Classification Search
None
See application file for complete search history.

(56) References Cited

U.S. PATENT DOCUMENTS

| | | | |
|---|---|---|---|
| 2011/0320149 A1* | 12/2011 | Lee ......................... | H01L 22/12 702/83 |
| 2015/0302568 A1 | 10/2015 | Hirai et al. | |
| 2018/0107903 A1* | 4/2018 | Yong ..................... | G06T 7/0004 |
| 2020/0105500 A1* | 4/2020 | Chou ..................... | H01J 37/22 |
| 2020/0184628 A1* | 6/2020 | Bhattacharyya ... | G01N 23/2251 |

* cited by examiner

*Primary Examiner* — Idowu O Osifade
(74) *Attorney, Agent, or Firm* — Maschoff Brennan

(57) ABSTRACT

A system includes an inspection device and an image processing unit. The inspection device is configured to scan a wafer to generate an inspected image. The image processing unit is configured to receive the inspected image, and is configured to analyze the inspected image by using at least one deep learning algorithm in order to determine whether there is any defect image shown in a region of interest in the inspected image. When there is at least one defect image shown in the region of interest in the inspected image, the inspection device is further configured to magnify the region of interest in the inspected image to generate a magnified inspected image for identification of defects.

20 Claims, 6 Drawing Sheets

INSPECTION AND CLEANING SYSTEM AND METHOD FOR THE SAME

BACKGROUND

A wafer is processed by semiconductor processing equipment in order to fabricate semiconductor device. During the processes, the wafer has chance to be contaminated. The inspection of wafer maintains the throughput of the semiconductor device. The wafer inspection is thus performed in different situations as desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
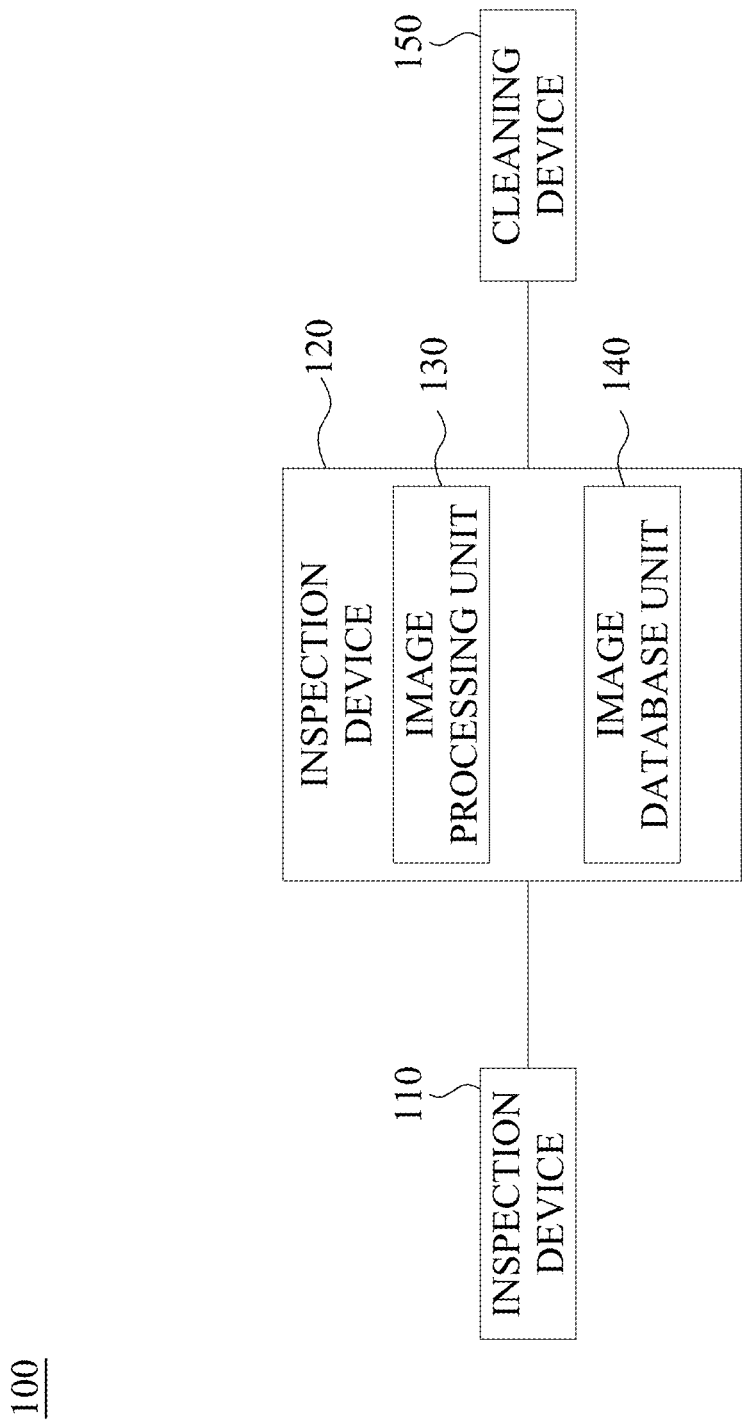
FIG. 1 is a schematic diagram of an inspection system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In this document, the term "coupled" may also be termed as "electrically coupled", and the term "connected" may be termed as "electrically connected". "Coupled" and "connected" may also be used to indicate that two or more elements cooperate or interact with each other.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference is now made to FIG. 1. FIG. 1 is a schematic diagram of an inspection and cleaning system 100, in accordance with some embodiments of the present disclosure. In some embodiments, the inspection and cleaning system 100 is configured to inspect a wafer in semiconductor manufacturing processes. The inspection and cleaning system 100 is configured to inspect the wafer to determine whether a defect exits on the wafer. In some embodiments, the inspection and cleaning system 100 is further configured to clean the wafer when the defect exists on the wafer.

In some embodiments, the inspection and cleaning system 100 includes an inspection device 110, an inspection device 120, and a cleaning device 150. For illustration in FIG. 1, the inspection device 110 is coupled to the inspection device 120. The inspection device 120 is coupled to the cleaning device 150. The inspection device 120 is coupled between the inspection device 110 and the cleaning device 150.

In some embodiments, the inspection device 110 is configured to scan a wafer to determine whether a potential defect exists on the wafer. In some embodiments, the potential defect is a real defect existing on the wafer. In some embodiments, the wafer is scanned after being processed by at least one semiconductor process. In some embodiments, the at least one semiconductor process includes a deposition process. For example, the wafer is scanned after being processed under a poly-silicon gate deposition process performed by a plasma enhanced chemical vapor deposition (PECVD) type device. In some embodiments, the inspection device 110 is implemented by an optical microscope type device.

The implementation of the inspection device 110, the at least one semiconductor process, and the tools performing the at least one semiconductor process are provided for illustrative purposes. Various implementations of the inspection device 110, the at least one semiconductor process, and the tools performing the at least one semiconductor process are within the contemplated scope of the present disclosure.

In some embodiments, the inspection device 120 is configured to further scan the wafer. The inspection device 120 is further configured to generate a first inspected image of the wafer. For illustration, when the inspection device 110 finds a potential defect on the wafer, the wafer is transferred for the inspection device 120 to further scan. Then, the inspection device 120 is configured to generate the first inspected image which includes a region of interest where the image of the potential defect is shown. Alternatively stated, the first image generated by the inspection device 120 has the image of the potential defect detected by the inspection device 110 shown in the region of interest.

In some embodiments, the inspection device 120 is implemented by a scanning electron microscope (SEM) type device. The inspection device 120 is also referred to as a review SEM in some embodiments. The above implementation of the inspection device 120 is provided for illustrative purposes. Various implementations of the inspection device 120 are within the contemplated scope of the present disclosure.

For illustration in FIG. 1, the inspection device 120 includes an image processing unit 130. In some embodiments, the image processing unit 130 is configured to receive the first inspected image generated by the inspection device 120. In some embodiments, the image processing unit 130 is further configured to analyze the first inspected image in order to determine whether there is any defect image shown in the region of interest in the first inspected image. Alternatively stated, the image processing unit 130 is configured to determine whether the potential defect detected by the inspection device 110 exactly exists on the wafer. For example, when the potential defect detected by the inspection device 110 is a real defect, the image processing unit 130 is able to analyze the first inspected image to determine that there is a defect existing on the wafer.

In some embodiments, the image process unit 130 is configured to generate a reference image. The reference image is configured to be compared with the first inspected image in order to analyze the first inspected image. In some embodiments, the reference image has the same image of semiconductor features as the first inspected image has, and is an image which has no defect image thereon. In some embodiments, the image processing unit 130 is configured to generate a number of reference images, and is configured to analyze the first inspected image by comparing the first inspected image with the reference images.

In some embodiments, the image processing unit 130 is configured to generate the reference image by using at least one deep learning algorithm. In some embodiments, the reference image is a virtual image generated by executing programming codes. In some other embodiments, the reference image is a real image.

The at least one deep learning algorithm used by image processing unit 130 includes a convolutional neural network (CNN), a multi-box feature mapping, a transfer learning, or a combination thereof. The detailed operations of the deep learning algorithm will be described below with reference to FIG. 2D. The above deep learning algorithms are provided for illustrative purposes. Various deep learning algorithms are within the contemplated scope of the present disclosure.

In some embodiments, the image processing unit 130 is implemented by a machine learning type device, a processor, a computer, or a combination thereof. The machine learning type device, the processor, the computer, or the combination thereof are configured to perform the at least one deep learning algorithm to analyze the first inspected image. The implementations of the image processing unit 130 are provided for illustrative purposes. Various implementations of the image processing unit 130 are within the contemplated scope of the present disclosure.

For illustration in FIG. 1, the inspection device 120 further includes an image database unit 140. In some embodiments, the image database unit 140 is configured to store the reference image generated by the image processing unit 130 as discussed above. In some other embodiments, the image database unit 140 is configured to store images other than the reference image generated by the image processing unit 130. For example, the image database unit 140 is configured to store the first inspected image generated by the inspection device 120. For another example, the image database unit 140 is configured to store other images generated by the inspection device 120, as will be described below.

In some embodiments, the image processing unit 130 is configured to analyze the first inspected image by superimposing the first inspected image with the reference image. The image processing unit 130 superimposes the first inspected image with the reference image to determine whether a difference exists in the first inspected image when being compared with the reference image. When there is a difference between the first inspected image and the reference image, the image processing unit 130 determines that there is a defect image within the first inspected image.

In some other embodiments, the image processing unit 130 is configured to analyze the first inspected image without generating the reference image. The image processing unit 130 is configured to analyze the first inspected image by performing the at least one deep learning algorithm, in order to determine whether the potential defect detected by the inspection device 110 exists on the wafer.

The above analyzing operations to the first inspected image generated by the inspection device 120, performed by the image processing unit 130, are provided for illustrative purposes. Various analyzing operations to the first inspected image generated by the inspection device 120 are within the contemplated scope of the present disclosure.

In some embodiments, the inspection device 120 is configured to magnify the first inspected image when there is at least one defect image existing in the first inspected image. The inspection device 120 magnifies the defect image in the first inspected image in order to inspect the defect. In some embodiments, the inspection device 120 is further configured to magnify the first inspected image including the defect image to generate a second inspected image. Alternatively stated, the second inspected image includes the defect image being magnified.

In some embodiments, after the second inspected image is generated, the defect is able to be identified based on the second inspected image. In some embodiments, the identification of the defect is performed based on the classification of the defect, the size of the defect, and the coordination of the defect with respect to the wafer. For example, the location of the defect image in the first inspected image, the location of the defect image in the second inspected image, and the location of the defect on the wafer are also able to be identified. For another example, an external particle contamination type of the defect on the wafer is able to be identified, and/or a deformation pattern type of the defect on the wafer is able to be identified.

In some embodiments, the information of the identification of the defect is transmitted to the image database unit 140. The image database unit 140 is further configured to store the information of the identification of the defect corresponding to the first inspected image and/or the second inspected image.

As discussed above, the first inspected image and/or the second inspected image would be generated in each inspection process. Alternatively stated, there are a number of first inspected images and/or the second inspected images generated after a number of inspection processes. The first inspected images and/or second inspected images being generated are referred to as historical first inspected images and historical second inspected in some embodiments. In some embodiments, the image database unit 140 is further configured to store historical first inspected images and historical second inspected images as discussed above. The stored historical first inspected images and the stored historical second inspected images are utilized for the application of deep learning algorithm.

As illustrated in FIG. 1, the image processing unit 130 and the image database unit 140 are implemented in the inspection device 120. However, the present disclosure is not limited thereto herein. For example, in various embodiments, the image processing unit 130 and the image database unit 140 are implemented outside the inspection device 120 and externally coupled to the inspection device 120.

In some embodiments, the cleaning device 150 is configured to clean the wafer in order to remove the defect. The cleaning device 150 cleans the wafer based on the identification of the defect. For example, the cleaning device 150 cleans the wafer according to the classification of the defect, the size of the defect, the coordination of the defect, or the combination thereof.

The above configuration of the inspection and cleaning system 100 is provided for illustrative purposes. Various configurations of the inspection and cleaning system 100 are within the contemplated scope of the present disclosure. For example, in various embodiments, the inspection device 110 is not configured in the inspection and cleaning system 100, and only the inspection device 120 performs the inspection.

In some embodiments, one or more semiconductor processing tools are coupled to the inspection and cleaning system 100. For example, the wafer is processed by one of the semiconductor processing tools and is inspected by the inspection and cleaning system 100, in order to inspect whether a defect exists on the wafer. After the wafer is inspected and cleaned by the inspection and cleaning system 100, the wafer is transferred to another one of the semiconductor processing tools. In some embodiments, the inspection and cleaning system 100 is also referred to as a defect review system.

Figure 2A:
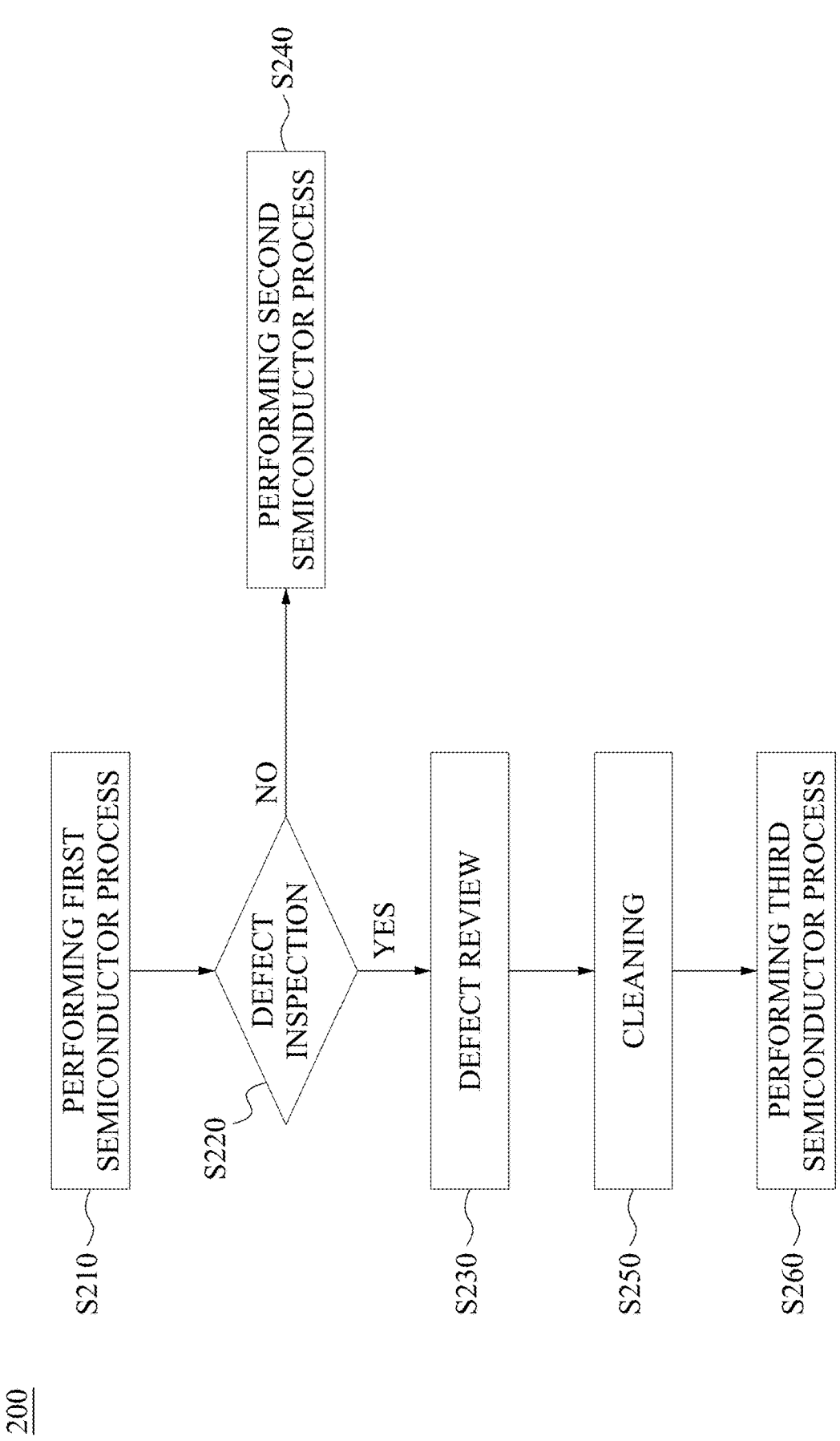
FIG. 2A is a flow chart of a method associated with the inspection system as illustrated in FIG. 1, in accordance with some embodiments.

Reference is now made to FIG. 2A. FIG. 2A is a flow chart of a method 200 associated with the inspection and cleaning system 100 as illustrated in FIG. 1, in accordance with some embodiments of the present disclosure. For illustration in FIG. 2A, the method 200 includes operations S210, S220, S230, S240, S250, and S260. In some embodiments, part of the method 200 is performed by the inspection and cleaning system 100 as shown in FIG. 1. For example, operations S220, S230, and S250 are performed by the inspection and cleaning system 100.

In operation S210, a first semiconductor process is performed by one of the semiconductor processing tools on the wafer. In some embodiments, the first semiconductor process is a poly-silicon gate deposition process. In some other embodiments, the first semiconductor process is metal gate deposition process.

After the operation S210 is performed, in some embodiments, the wafer has a chance to be contaminated during the first semiconductor process.

In operation S220, the wafer is inspected by the inspection device 110 of the inspection and cleaning system 100 as shown in FIG. 1. For illustration, the inspection device 110 is configured to scan the wafer to determine whether a potential defect exists on the wafer.

In operation S220, when the wafer is determined as having a potential defect, as illustrated in FIG. 2A, the operation S230 is performed. In contrast, when the wafer is determined as having no potential defect, as illustrated in FIG. 2A, the operation S240 is performed.

In operation S230, the potential defect on the wafer is reviewed by the inspection device 120 of the inspection and cleaning system 100 as shown in FIG. 1, after the wafer is determined as having the potential defect. The further description of the operation S230 will be described in detail below with reference of FIG. 2B and FIG. 2C.

In operation S240, a second semiconductor process is performed by another one of the semiconductor processing tools on the wafer, after the wafer is determined as having no potential defect.

In operation S250, after the wafer is reviewed by the inspection device 120, the wafer is cleaned by the cleaning device 150 of the inspection and cleaning system 100 as shown in FIG. 1, in order to remove the defect.

In operation S260, a third semiconductor process is performed by other one of the semiconductor processing tools on the wafer. In some embodiments, the third semiconductor process is the same as the second semiconductor process. In some other embodiments, the third semiconductor process is different from the second semiconductor process.

The above illustrations include exemplary operations, but the operations are not necessarily performed in the order shown. Operations may be added, replaced, changed order, and/or eliminated as appropriate, in accordance with the spirit and scope of various embodiments of the present disclosure.

Figure 2B:
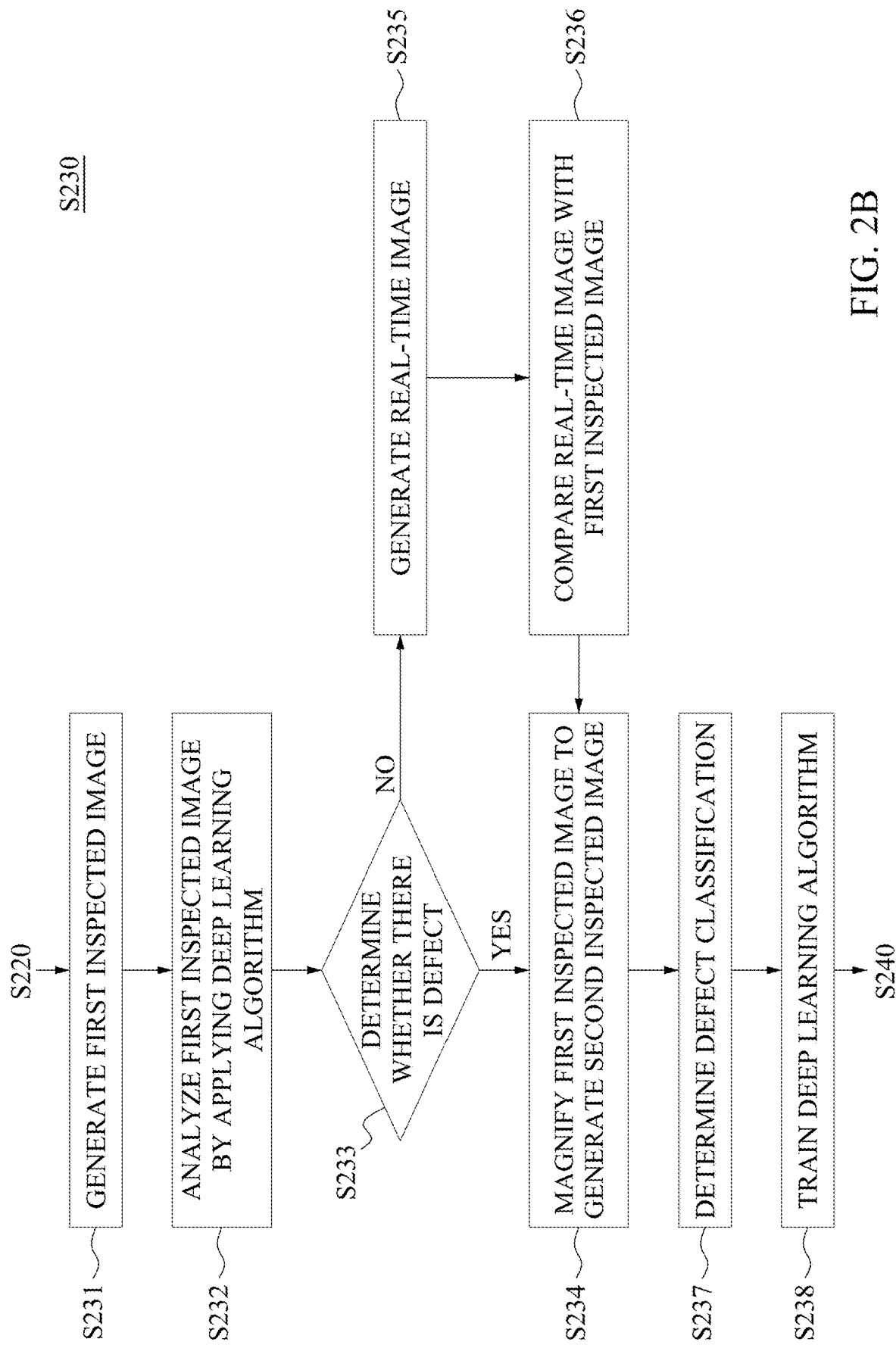
FIG. 2B is a flow chart of a method associated with the method as illustrated in FIG. 2A, in accordance with some embodiments.
Figure 2C:
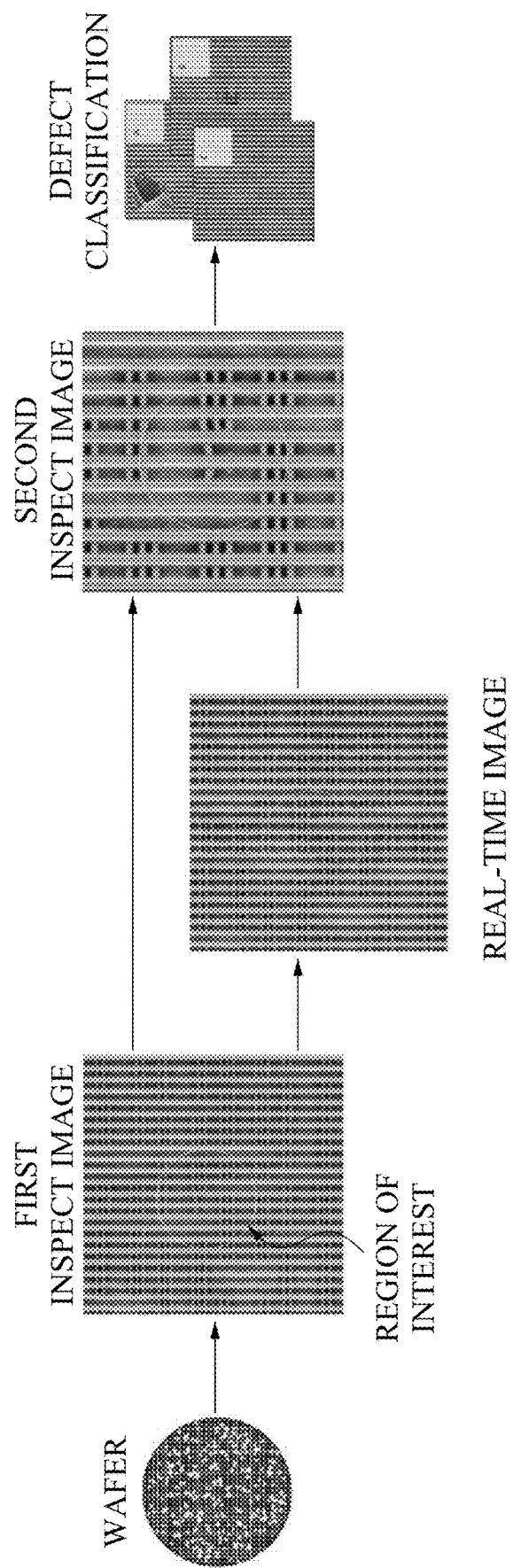
FIG. 2C is a schematic diagram of a wafer performed under the methods as illustrated in FIG. 2A and FIG. 2B, in accordance with some embodiments.

Reference is now made to FIG. 2B and FIG. 2C. FIG. 2B is a flow chart of the operation S230 of the method 200 as illustrated in FIG. 2A, in accordance with some embodiments of the present disclosure. FIG. 2C is a schematic diagram of a wafer performed under the method 200 as illustrated in FIG. 2A and FIG. 2B, in accordance with some embodiments of the present disclosure.

For illustration in FIG. 2B, the operation S230 includes operations S231, S232, S233, S234, S235, S236, S237, and S238. As illustrated in FIG. 2A and FIG. 2B, the operation S230 is performed after the operation S220 when the wafer is determined as having the potential defect, and the operation S240 is performed after the operation S230. The operation S220 and S240 shown in FIG. 2B are provided for ease of understanding, and the operation S220 and S240 are not included in the operation S230.

In operation S231, the first inspected image of the wafer is generated by the inspection device 120. As illustrated in FIG. 2C, the first inspected image includes a region of interest where the potential defect is located. In some embodiments, the first inspected image is stored into the image database unit 140.

In operation S232, the first inspected image is analyzed by applying the at least one deep learning algorithm. In some embodiments, the first inspected image is analyzed by the image processing unit 130. The image processing unit 130 applies the at least one deep learning algorithm to analyze the first inspected image. The further description of the operation S232 will be described in detail below with reference to FIG. 2D.

In some embodiments, in operation S232, the image processing unit 130 generates the at least one reference image by applying the at least one deep learning algorithm with respect to the first inspected image. The at least one reference image is compared with the first inspected image, in order to analyze the first inspected image. The at least one reference image is superimposed with the first inspected image. The first inspected image when being compared with the reference image includes the information of the first inspected image and the at least one reference image, and is provided for the following operation S233 to determine.

In some other embodiments, in operation S232, the image processing unit 130 analyzes the first inspected image without generating reference images. The image processing unit 130 applies the at least one deep learning algorithm to analyze the first inspected image, and provides an analyzed result for the following operation S233 to determine.

In operation S233, after the first inspected is analyzed, the image processing unit 130 determines whether the potential defect detected by the inspection device 110 exists on the wafer.

In operation S233, when the potential defect is determined existing on the wafer, as illustrated in FIG. 2B, the operation S234 is performed. In contrast, when the potential defect is determined non-existing on the wafer, as illustrated in FIG. 2B, the operation S235 is performed.

In operation S234, the inspection device 120 magnifies the first inspected image to generate the second inspected image. As illustrated in FIG. 2C, the second inspected image is generated based on the first inspected image. The image of defect in the first inspected image is magnified, and the defect image being magnified is presented in the second inspected image. In some embodiments, the second image is stored into the image database unit 140.

In operation S235, the inspection device 120 generates a real-time image according to the first inspected image. As illustrated in FIG. 2C, the real-time image includes the same patterns presented in the first inspected image. In some embodiments, compared to the first inspected image, the real-time image has no image of defect presented thereon. Alternatively stated, the real-time image is a perfect image only including the desired patterns.

In some embodiments, the wafer is divided into several dies, and each of the dies has the same size and the same patterns thereon. When the first inspected image is generated based on a particular die of the wafer, the real-time image is generated based on another die different from the particular die. In some embodiments, the real-time image is generated based on the die directly beside the particular die.

In operation S236, the real-time image is compared with the first inspected image. In some embodiments, the real-time image is superimposed with the first inspected image, in order to find the image of defect in the first inspected image. After the real-time image is superimposed with the first inspected image, the image of defect in the first inspected image is able to be identified. In some embodiments, the location of the image of defect in the first inspected image is identified.

After the operation S236 is performed, the operation S235 is performed. In some embodiments, the second inspected image is generated based on the first inspected image and the real-time image. The first inspected image is magnified to generate the second inspected image according to the location of the image of defect found during the operation S236. The second inspected image thus includes the defect image being magnified.

In some approaches, the inspection device generates a real-time image when the inspection device performs the inspection every time. The inspection device does not apply the deep learning algorithm to analyze the inspected image. Therefore, the inspection device spends much time on generating the real-time image other than spends less time by applying the deep learning algorithm to analyze the inspected image. The manufacturing efficiency is reduced. The time cost of the manufacturing in increased.

Compared to the above approaches, the inspection device 120 is able to apply the deep learning algorithm to analyze the first inspected image. When the potential defect is found by applying the deep learning algorithm, the inspection device 120 does not need to spend other time to generate the real-time image. The inspection device 120 is able to proceed the semiconductor process faster without spending time to generate the real-time image. The time duration of manufacturing is thus reduced. The manufacturing efficiency is thus increased.

In operation S237, the second inspected image is inspected to determine the defect classification. In some embodiments, the image of defect shown in the second inspected image is inspected to determine the defect classification. In some embodiments, the image of defect shown in the second inspected image is inspected to determine the coordination of defect on the wafer. Alternatively stated, the identification and the classification of defect are identified after the operation S237. In some embodiments, information of the identification and the classification of defect are sent to the image database unit 140 for storing.

As illustrated in FIG. 2C, the defect classification includes type A, type B, and type C. In some embodiments, when the classification of defect is type A, there is a large contaminated particle disposed on the wafer. In some embodiments, when the classification of defect is type B, there is a small contaminated particle disposed on the wafer. In some embodiments, when the classification of defect is type C, the pattern on the wafer has distortion. The above classifications of defect are provided for illustrative purposes. Various classifications of defect are within the contemplated scope of the present disclosure. For example, the pattern on the wafer has photoresist layer residual. In some embodiments, after inspecting the second inspected image, there is no image of defect is found.

In operation S238, the at least one deep learning algorithm is trained. The image processing unit 130 trains the at least one deep learning algorithm based on the second inspected image. In some embodiments, the image processing unit 130 trains the at least one deep learning algorithm based on the first inspected image, the second inspected image, and the identification and classification of defect. Alternatively stated, the at least one deep learning algorithm is modified according to the newly stored first inspected image, the newly stored second inspected image, and the identification and classification of defect identified during the latest operation S237.

The above illustrations include exemplary operations, but the operations are not necessarily performed in the order shown. Operations may be added, replaced, changed order, and/or eliminated as appropriate, in accordance with the spirit and scope of various embodiments of the present disclosure.

Figure 2D:
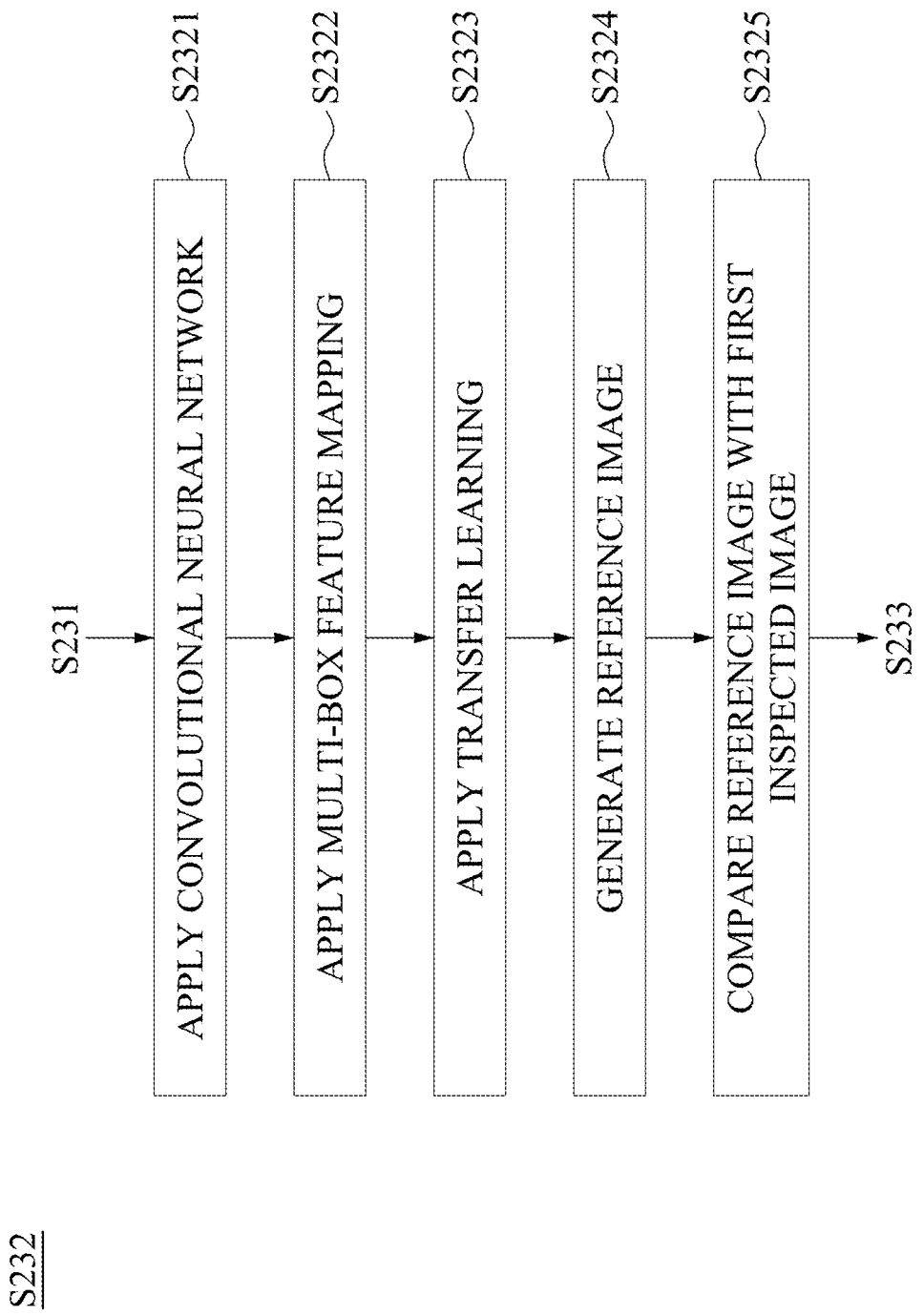
FIG. 2D is a flow char of a method associated with the methods as illustrated in FIG. 2B, in accordance with some other embodiments.

Reference is now made to FIG. 2D. FIG. 2D is a flow chart of the operation S232 in the method 200 as illustrated in FIG. 2A and FIG. 2B, in accordance with some other embodiments of the present disclosure.

For illustration in FIG. 2D, the operation S232 includes operations S2321, S2322, S2323, S2324, and S2325. As illustrated in FIG. 2B and FIG. 2D, the operation S2321 is performed after the operation S231 when the first inspected image is generated, and the operation S233 is performed after the operation S2325. The operation S231 and S233 shown in FIG. 2D are provided for ease of understanding, and the operation S231 and S233 are not included in the operation S232.

In operation S2321, a convolutional neural network (CNN) is applied in order to analyze the first inspected image. The image processing unit 130 applies the convolutional neural network to the first inspected image, the historical first inspected images, the second inspected image, and the historical second inspected images, in order to analyze the current first inspected image. In some embodiments, in operation S2321, the first inspected image, the historical first inspected images, the second inspected image, and the historical second inspected images are moved across a filter with a small size, and are performed convolution operations. In some embodiments, the convolution operations are associated with filter size and the pixels in the image (for example, the first inspected images.) In some alternatively embodiments, the operation S2321 is performed by applying a multi-layer perceptron type network.

In operation S2322, a multi-box feature mapping is applied in order to analyze the first inspect image. The image processing unit 130 applies the multi-box feature mapping to the historical first inspected images and the historical second inspected images, in order to analyze the current first inspected image. In some embodiments, the multi-box feature mapping is associated with a set of default bounding boxes with each feature map, for multiple feature maps at the top of the network. The default bounding boxes tile the feature map in a convolution manner, so that the position of each box relative to its corresponding map is fixed.

In operation S2323, a transfer learning is applied in order to analyze the first inspect image. The image processing unit 130 utilizes the historical first inspected image and the historical second image, in order to analyze the current first inspect image. In some embodiments, the image processing unit 130 further utilizes the current first inspected image and the current second inspected image to perform the transfer learning in the future operations, in order to analyze the first inspected image generated in the future.

In operation S2324, the reference image is generated. The image processing unit 130 generates the reference image according to the at least one deep learning algorithm. In some embodiments, the at least one deep learning algorithm includes the convolutional neural network in operation S2321, the multi-box feature mapping in operation S2322, the transfer learning in operation S2323, or a combination thereof.

In operation S2325, the reference image is compared with the first inspected image. The image processing unit 130 compares the reference image with the first inspected image. In some embodiments, the reference image is superimposed with the first inspected image, in order to find the image of defect in the first inspected image. After the reference image is superimposed with the first inspected image, the image of defect in the first inspected image is able to be found. In some embodiments, the location of the image of defect in the first inspected image is identified.

The above illustrations include exemplary operations, but the operations are not necessarily performed in the order shown. Operations may be added, replaced, changed order, and/or eliminated as appropriate, in accordance with the spirit and scope of various embodiments of the present disclosure. For example, the operation S2324 is omitted. For another example, the first inspected image is compared without generating the reference image.

Figure 2E:
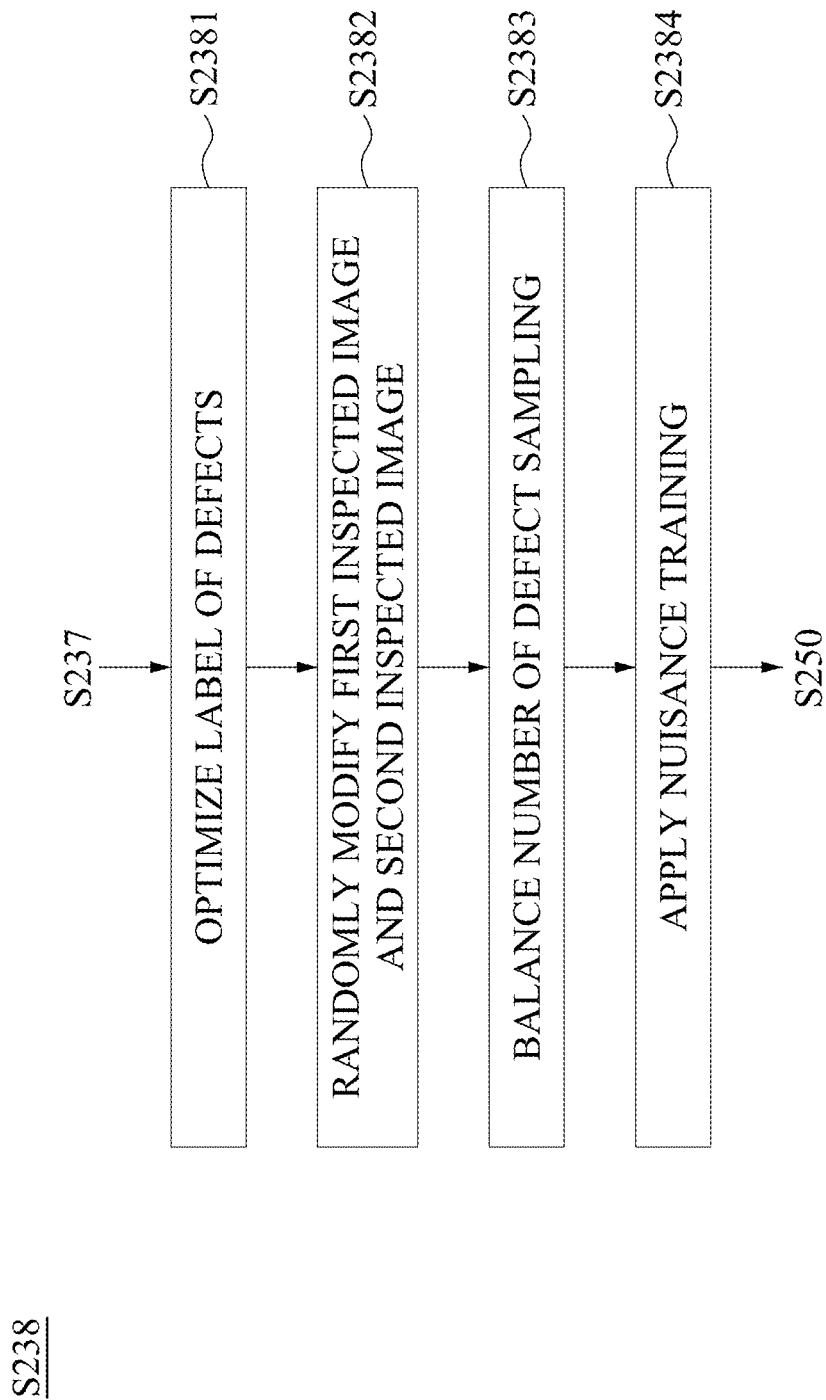
FIG. 2E is a flow char of a method associated with the methods as illustrated in FIG. 2A and FIG. 2B, in accordance with some alternative embodiments.

Reference is now made to FIG. 2E. FIG. 2E is a flow chart of the operation S238 of the method 200 as illustrated in FIG. 2A and FIG. 2B, in accordance with some alternative embodiments of the present disclosure.

For illustration in FIG. 2E, the operation S238 includes operations S2381, S2382, S2383, and S2384. As illustrated in FIG. 2A, FIG. 2B, and FIG. 2E, the operation S2381 is performed after the operation S237 when the identification and the classification of defect are identified, and the operation S250 is performed after the operation S2384. The operation S237 and S250 shown in FIG. 2D are provided for ease of understanding, and the operation S237 and S250 are not included in the operation S238.

In operation S2381, the at least one deep learning algorithm is trained by optimizing label of defect. The image processing unit 130 trains the at least on deep learning algorithm by optimizing the labels of defect identified in the operation S237. In some embodiments, the labels of defect indicate the defect classification. Based on the labels of defect, an image of defect is able to be connected to the corresponding label of defect by the at least one deep learning algorithm.

In operation S2382, the at least one deep learning algorithm is trained by randomly modifying the first inspected image and the second inspected image. The image processing unit 130 trains the at least on deep learning algorithm by randomly modifying the first inspected image and the second inspected image, in order to generate plurality of new inspected images for the further training. The modification includes horizontal flipping, contrast adjustment, saturation adjustment, cropping, brightness adjustment, or a combination thereof. In some embodiments, the image processing unit 130 further trains the at least on deep learning algorithm by randomly modifying the historical first inspected images and the historical second inspected images. The modifications are provided for illustrative purposes. Various modifications are within the contemplated scope of the present disclosure.

In operation S2383, the at least one deep learning algorithm is trained by balancing the number of defect sampling. The image processing unit 130 trains the at least on deep learning algorithm by balancing the number of defect sampling. In some embodiments, the image processing unit 130 trains the at least one deep learning algorithm by choosing different classifications of defect, and balances the number of chosen classifications of defect from the images stored in the image database unit 140 for training. For example, the image processing unit 130 chooses less than five samples in each of classifications of defect to train the at least one deep learning algorithm.

In operation S2384, the at least one deep learning algorithm is trained by nuisance training. The image processing unit 130 trains the at least on deep learning algorithm by nuisance training. In some embodiments, the at least one deep learning algorithm is trained by normal images only, in which the normal images are images without defects. In some further embodiments, the normal images are design patterns.

The above illustrations include exemplary operations, but the operations are not necessarily performed in the order shown. Operations may be added, replaced, changed order, and/or eliminated as appropriate, in accordance with the spirit and scope of various embodiments of the present disclosure.

In some embodiments, a system is disclosed that includes an inspection device and an image processing unit. The inspection device is configured to scan a wafer to generate an inspected image. The image processing unit is configured to receive the inspected image, and configured to analyze the inspected image by using at least one deep learning algorithm in order to determine whether there is any defect image shown in a region of interest in the inspected image. When there is at least one defect image shown in the region of interest in the inspected image, the inspection device is further configured to magnify the region of interest in the inspected image to generate a magnified inspected image for identification of defects.

Also disclosed is a method includes following operations. A first inspected image of a region on a wafer is generated by an inspection device. If there is any defect image shown in a region of interest in the first inspected image, the defect image is identified by applying at least one deep learning algorithm. When there is at least one defect image shown in the region of interest in the first inspected image, a second inspected image including magnification of the at least one defect image in the region of interest generating is inspected by the inspection device.

Also disclosed is a method includes following operations. A wafer is scanned by an inspection device to generate a first inspected image. The first inspected image is analyzed by applying at least one deep learning algorithm to determine whether there is any defect image shown in a region of interest in the first inspected image. When there is at least one defect image shown in the region of interest in the first inspected image, the region of interest in the first inspected image is magnified by the inspection device to generate a second inspected image for identification and classification of defects The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
   an inspection device configured to scan a wafer to generate an inspected image; and
   an image processing unit configured to receive the inspected image, and configured to compare the inspected image with at least one reference image by using at least one deep learning algorithm in order to determine a difference indicating whether there is any defect image shown in a region of interest in the inspected image,
   wherein when there is at least one defect image shown in the region of interest in the inspected image, the inspection device is further configured to magnify the region of interest in the inspected image to generate a magnified inspected image for identification of defects.

2. The system of claim 1, wherein when there is the at least one defect image shown in the region of interest in the inspected image, the image process unit is configured to analyze the inspected image by using the at least one deep learning algorithm to generate the at least one reference image.

3. The system of claim 2, further comprising:
   an image database unit configured to store the at least one reference image, wherein the at least one reference image is generated by using the at least one deep learning algorithm including a convolutional neural network (CNN) with multi-box feature mapping, a transfer learning, or the combination thereof.

4. The system of claim 1, wherein when there is no defect image shown in the region of interest in the inspected image, the inspection device is further configured to generate a real-time image of a region different from the region of interest.

5. The system of claim 1, wherein the at least one deep learning algorithm comprises:
   a convolutional neural network;
   a multi-box feature mapping; and
   a transfer leaning.

6. The system of claim 1, wherein the image processing unit is further configured to train the at least one deep learning algorithm by learning the inspected image.

7. The system of claim 1, wherein the inspection device comprises a scanning electron microscope (SEM) type device, and the image processing unit is configured inside the SEM type device.

8. A method, comprising:
   generating, by an inspection device, a first inspected image of a region on a wafer;
   identifying if there is any defect image shown in a region of interest in the first inspected image by applying at least one deep learning algorithm; and
   when there is at least one defect image shown in the region of interest in the first inspected image, generating, by the inspection device, a second inspected image including magnification of the at least one defect image in the region of interest, and generating no reference image to be compared with the first inspected image.

9. The method of claim 8, further comprising:
   when identifying if there is no defect image, the inspection device generating a real-time image to be compared with the first inspected image.

10. The method of claim 8, further comprising:
    training, by an image processing unit, the at least one deep learning algorithm based on the first inspected image and the second inspected image.

11. The method of claim 10, wherein training the at least one deep learning algorithm comprises:
    optimizing labels of defects on the region of interest;
    randomly modifying the first inspected image and the second inspected image to create a plurality of inspected images;
    balancing numbers of defect samplings; and
    applying a nuisance training.

12. The method of claim 8, wherein applying at least one deep learning algorithm comprises:
    applying a convolutional neural network, a multi-box feature mapping, a transfer learning, or a combination thereof.

13. The method of claim 8, further comprising:
    cleaning, by a cleaning device, the wafer based on the second inspected image.

14. The method of claim 9, wherein the real-time image includes at least one pattern that is presented in the first inspected image and has no image of defect.

15. A method, comprising:
    scanning a wafer, by an inspection device, to generate a first inspected image;
    applying at least one deep learning algorithm to compare the first inspected image with at least one reference image, to determine a difference indicating whether there is any defect image shown in a region of interest in the first inspected image; and when there is at least one defect image shown in the region of interest in the first inspected image, magnifying, by the inspection device, the region of interest in the first inspected image, to generate a second inspected image for identification and classification of defects.

16. The method of claim 15, wherein when there is no defect image shown in the region of interest in the first inspected image, scanning the wafer, by the inspection device, to generate a third inspected image as the at least one reference image to be compared with the first inspected image, for identification of defects.

17. The method of claim 15, further comprising:

when analyzing the first inspected image, the inspection device generating no reference image to be compared with the first inspected image.

18. The method of claim 15, further comprising:

training, by an image processing unit, the at least one deep learning algorithm by optimizing labels, modifying the first inspected image and the second inspected image, balanced sampling, and nuisance training.

19. The method of claim 15, wherein applying the at least one deep learning algorithm comprises:

applying a convolutional neural network, a multi-box feature mapping, a transfer learning, or a combination thereof.

20. The method of claim 15, further comprising:

training, by an image processing unit, the at least one deep learning algorithm based on the first inspected image and the second inspected image, in order to perform determining whether there is any defect image in a new inspected image.

* * * * *